US012707769B2

(12) United States Patent
Reith et al.

(10) Patent No.: US 12,707,769 B2
(45) Date of Patent: Aug. 11, 2026

(54) LED PACKAGE FOR UV LIGHT AND PROCESS

(71) Applicant: ams-OSRAM International GmbH, Regensburg (DE)

(72) Inventors: Andreas Reith, Steinach (DE); Joerg Sorg, Regensburg (DE); Nikolaus Gmeinwieser, Donaustauf (DE); Dominik Scholz, Abbach (DE); Manfred Wolf, Kirchroth-Thalstetten (DE)

(73) Assignee: ams-OSRAM International GmbH, Regensburg (DE)

( * ) Notice: Subject to any disclaimer, the term of this patent is extended or adjusted under 35 U.S.C. 154(b) by 692 days.

(21) Appl. No.: 18/030,725

(22) PCT Filed: Oct. 8, 2021

(86) PCT No.: PCT/EP2021/077961

§ 371 (c)(1),
(2) Date: Apr. 6, 2023

(87) PCT Pub. No.: WO2022/074247

PCT Pub. Date: Apr. 14, 2022

(65) Prior Publication Data

US 2023/0378398 A1 Nov. 23, 2023

(30) Foreign Application Priority Data

Oct. 8, 2020 (DE) ..................... 10 2020 126 391.0

(51) Int. Cl.

| | |
|---|---|
| ***H10H 20/85*** | (2025.01) |
| ***H10H 20/01*** | (2025.01) |
| ***H10H 20/81*** | (2025.01) |
| ***H10H 20/822*** | (2025.01) |
| ***H10H 20/841*** | (2025.01) |
| ***H10H 20/851*** | (2025.01) |
| ***H10H 20/856*** | (2025.01) |
| ***H10H 20/857*** | (2025.01) |

(Continued)

(52) U.S. Cl.
CPC ........ *H10H 20/8506* (2025.01); *H10H 20/81* (2025.01); *H10H 20/822* (2025.01); (Continued)

(58) Field of Classification Search
CPC .......................... H01L 25/167; H10H 20/8506
See application file for complete search history.

(56) References Cited

U.S. PATENT DOCUMENTS

| | | | |
|---|---|---|---|
| 8,044,412 | B2 | 10/2011 | Murphy et al. |
| 2004/0079957 | A1 | 4/2004 | Andrews et al. |

(Continued)

FOREIGN PATENT DOCUMENTS

| | | | |
|---|---|---|---|
| CN | 103618041 | B | 3/2016 |
| DE | 102018102961 | A1 | 8/2019 |

OTHER PUBLICATIONS

International Search Report for International Patent Application No. PCT/EP2021/077961, mailed Mar. 14, 2022 (8 pages).

*Primary Examiner* — Mark W Tornow
(74) *Attorney, Agent, or Firm* — ArentFox Schiff LLP

(57) ABSTRACT

The invention relates to an LED package for UV light comprising an optoelectronic device which, in particular as a volume emitter, is designed to emit light in the ultraviolet spectrum during operation. The component is arranged on a carrier with two contact pads for electrical contacting. Furthermore, a frame surrounding the component and arranged on the carrier is provided with a gas-impermeable outlet region lying in a main radiation direction, so that a hermetically sealed cavity comprising an inner region of the carrier is formed, the side walls of the frame facing the optoelectronic device being bevelled and opening towards the main radiation direction. An ESD protection element arranged outside the inner area on the carrier is electrically connected to at least one of the two contact pads.

22 Claims, 8 Drawing Sheets

(51) Int. Cl.
*H10W 70/652* (2026.01)
*H10W 90/00* (2026.01)
*H10W 90/10* (2026.01)

(52) U.S. Cl.
CPC ........ *H10H 20/841* (2025.01); *H10H 20/851* (2025.01); *H10H 20/856* (2025.01); *H10H 20/857* (2025.01); *H10W 90/00* (2026.01); *H10H 20/0363* (2025.01); *H10W 70/6528* (2026.01); *H10W 90/10* (2026.01)

(56) References Cited

U.S. PATENT DOCUMENTS

2005/0121686 A1 6/2005 Keller et al.
2006/0022214 A1* 2/2006 Morgan .................... F21K 9/00 257/E25.032
2007/0194422 A1* 8/2007 Lai ........................ H10W 90/00 257/E25.032
2008/0290353 A1* 11/2008 Medendorp, Jr ..... H10W 90/00 257/89
2009/0290273 A1* 11/2009 Shih ...................... H10W 90/00 257/E33.044
2010/0213496 A1* 8/2010 Chen ..................... H10W 90/00 257/E33.066
2012/0273833 A1* 11/2012 Chen ..................... H01L 25/167 257/E33.058
2014/0197438 A1* 7/2014 Oh ....................... H10H 20/857 257/98
2015/0014731 A1* 1/2015 Park ...................... H01L 25/167 257/98
2018/0190869 A1* 7/2018 Matsuda ................. H01L 24/42
2020/0313049 A1 10/2020 Huang et al.

* cited by examiner 13
121b
131
121a
13
13

13
121b
121a
131

13
a)
121a
121a
121a
121b
121a
131
121b
b)
10
121a'
131'
112'
111'

LED PACKAGE FOR UV LIGHT AND PROCESS

The present application is a 35 U.S.C. § 371 National Phase of PCT Application No. PCT/EP2021/077961, filed Oct. 8, 2021, which claims the priority of German patent application 10 2020 126 391.0 dated Oct. 8, 2020, the disclosures of which are hereby incorporated by reference in their entireties.

The present invention relates to an LED package for UV light. The invention further relates to a method of manufacturing an LED package for UV light.

BACKGROUND

In connection with newer optical metrological issues and also current applications, the need for simple, robust and cost-effective solutions for generating UV light is becoming increasingly relevant. In addition to already known applications, for example in the field of spectroscopy, to support photocatalytic curing of polymers or as a light source for a light conversion, applications for disinfection are increasingly gaining importance. Ultraviolet light, generally UV light with wavelengths of 350 nm and shorter, is suitable not only for personal care applications (keyword solarium) but also for the disinfection of equipment or liquids. Here, irradiation with UV-C light, whose wavelength is in the range of 280 nm and below, is particularly suitable. UV-C light is also suitable for the inactivation of bacteria and viruses, including SARS-CoV-2 viruses, and is therefore suitable for filter systems.

Various requirements result from the application. The light source must be efficient in order to achieve the best possible disinfection performance. The disinfection solution is potentially used in installations for air purification. From this derives the requirement for very long operating and service lives. Since with the disinfection facilities the health and safety of people must be ensured, high demands are placed on reliability and operational safety. The environmental conditions at the installation positions are demanding in terms of temperature, humidity and corrosive condensates. In the installation positions, the components must withstand regular cleaning cycles, such as water jet cleaning (steam jet), steam sterilization and cleaning with chemically aggressive cleaning agents.

Therefore, packages for UV semiconductors have to be used which are insensitive on the one hand, and on the other hand protect the optoelectronic device hermetically, so that the above mentioned aspects, caused by aging phenomena, are delayed or avoided. There are already packages for optoelectronic devices in the UV range, mainly made of plastic or with bonded lids. However, these usually have a lower mechanical stability, age relatively quickly or do not prevent oxidation or other degradation of the component.

For the above-mentioned requirements, in particular for stability of the optoelectronic device, there is therefore a need to improve existing packages.

SUMMARY OF THE INVENTION

In the proposed concept, an opening of a frame with reflector is adjusted to the size of the optoelectronic device optimized. As a result, the aperture is only minimally larger than the optoelectronic device for generating UV-C light. In addition, the frame has a beveled reflector that deflects the laterally emitted light upward. The frame with reflector may have a window to create a hermetically sealed space for the LED. Alternatively, the frame with reflector can be filled with a medium. This medium is light-transmissive and protects the LED chip by its low permeability.

The frame with reflector is mounted gas-tight on the substrate. This can be done, for example, by circumferential soldering or bonding. In addition, ESD protection is provided for the optoelectronic device, but this is placed outside the area around which the frame is arranged. In the case of circumferential soldering on the upper side of the carrier, the electrical contact is made via the lower side of the carrier. If, on the other hand, the frame is glued to the carrier, the electrical contacting can be made both on the carrier top side and on the carrier rear side.

By optimizing the frame with reflector to the size of the optoelectronic device, the optical element can be reduced in size. This can reduce the cost of the optical element (frame with/without reflector) and window. By placing an ESD protection diode outside the cavity, the cavity can be further optimized. In addition, this also increases the brightness, since no light is absorbed by the protective diode. Furthermore, the reflector can thus be mounted directly next to the optoelectronic device. The light is immediately reflected upwards and not absorbed in the cavity.

In one aspect, an LED package for UV light and in particular UV-C light comprises an optoelectronic device that is designed to emit light in the ultraviolet spectrum during operation. The optoelectronic device can be a volume emitter in flip-chip technology. A volume emitter is a device in which at least part of the light exits not only from a main surface, but also along the side or other surfaces. Unlike a surface emitter, in simplified terms, a volume emitter also illuminates along its side surfaces. For example, a flip chip is a chip in which a substrate that is transparent to the emission wavelength is disposed on the semiconductor layers such that a substantial portion of the light emission occurs through the substrate. The chip may be mounted such that electrical contact is made entirely on the side of the semiconductor facing away from the substrate. For example, the substrate may be the growth substrate on which the semiconductor layers have been epitaxially deposited. By ultraviolet spectrum is meant light with a wavelength below 380 nm. In particular, the light may have a wavelength of less than 220 nm, i.e. lie in the so-called UV-C range.

The package comprises a carrier having two contact pads for electrically contacting the optoelectronic device arranged on the two contact pads. A frame surrounding the component and arranged on the carrier is arranged with a gas-impermeable outlet region lying in a main radiation direction on the carrier in such a way that a hermetically sealed cavity comprising an inner region of the carrier is formed, the side walls of the frame facing the optoelectronic device being beveled and opening towards the main radiation direction. Finally, an ESD protection element arranged outside the inner area on the carrier is provided, in particular in the form of an ESD protection diode which is electrically connected to at least one of the two contact pads. The ESD protection diode serves to protect the optoelectronic device against electrostatic discharge. In some aspects, the term "arranged outside the interior region on the carrier" means in particular that the ESD protection element is not located in the formed cavity on the carrier, i.e., for example, directly adjacent to the optoelectronic device. "On the carrier", however, also means that the ESD protection element is just not inside the carrier itself or even part of the carrier.

Rather, the proposed principle is intended to create a two-piece package in which the carrier and frame form separate but interconnected elements. In this way, greater flexibility is created, which has a particularly beneficial effect on the choice and positioning of the ESD protection element. Thus, in some aspects, the ESD protection element may also be a separate component that may be disposed within the frame on the carrier. Likewise, the ESD protection element may also be integrated within the frame. Referring again to the term “on the carrier”, it is thus also to be understood that the component is located above or over the carrier and is coupled thereto via the frame.

In one aspect, the frame is made of an inorganic material. Such fabrication may even be necessary in some aspects, since organic frames (or components of such frames) or even organic fasteners cannot be guaranteed not to outgas into the cavity. However, this is precisely what is to be avoided, since carbon-containing compounds have a negative impact on light generation and radiation in many applications. In particular, such frames are often also not gas-tight, so that it is not possible to speak of hermetic encapsulation as in the proposed principle.

In some aspects, the frame is formed with silicon into which a beveled wall is etched. An angle of the bevel of the wall is predetermined by suitable crystal direction when etched. In one aspect, the angle of the beveled sidewalls with respect to a parallel to the support is in the range of 50° to 60°, particularly between 54° and 55°. The beveled sidewalls of the frame may include a reflective layer, which may include being formed of aluminum or silver. In one aspect, the material may have a reflectance of >80% for light emitted from the optoelectronic device during operation.

Another aspect relates to geometric dimensions. For example, a height of the frame may be greater than a height of the optoelectronic device, in particular a height greater by a factor of 1.2 to 1.8. In one aspect, the interior region formed by the frame may substantially correspond to a footprint of the optoelectronic device. In such a case, the frame, or the beveled sidewall of the frame, is directly adjacent to the optoelectronic device. By extending the contact pads or a solder on the contact pads, the optoelectronic device may also be slightly elevated. Accordingly, it may be provided that the inner region formed by the frame has a smaller area than a base area of the optoelectronic device. In other words, the frame or a part thereof thus extends below the optoelectronic device. The component can thus sit on the frame. This embodiment is possible if a solder is provided or the contact pads are slightly raised so that the component is spaced from the surface of the carrier.

In another aspect, the gas-impermeable exit region lying in the main radiation direction is formed by a transparent window which is attached in its edge region to an upper side of the circumferential frame, in particular in a continuous manner. The fastening can be done by bonding or a solder. For example, a solder comprising gold can be provided on the upper side of the frame, which is deposited over the entire upper side and to which the window is attached in a gas-tight manner. The window may have $SiO_2$ or $Al_2O_3$. In addition, the cavity may be filled with a transparent material. This can create a smoother refractive index transition. The material can thus serve to match the refractive index to the window or to the air surrounding the package.

Furthermore, in one embodiment, the frame is attached to the carrier in a gas-tight manner. This attachment may be via a metallic solder, which may include gold, extending completely along the underside of the frame. Then, in one aspect, at least one via is provided in the interior of the carrier that is connected to one of the two contact pads.

In addition to the contact pads for the optoelectronic device, the carrier can also comprise two further contact pads on its upper side, each of which is electrically connected to the corresponding contact pads in the inner area and on which the ESD protection diode is arranged.

Another aspect concerns the shape, design and arrangement of the ESD protection diode. ESD protection diodes are typically constructed of silicon in which the ESD protection is implemented as a fast diode. In one aspect, the frame may comprise a cavity open to the carrier in which the ESD protection element, in particular the ESD protection diode, is arranged. In this regard, in one embodiment, a metallization is provided on a base side of the frame to connect the frame to the carrier and electrically isolate the frame from contact pads on the carrier in the region of the cavity. The cavity of the frame may be open to the interior, provided further that the remainder of the frame provides a gas-tight seal. Existing SMD diodes can be used, which are soldered to the carrier and arranged electrically parallel to the component to be protected, for example. Typical SMD sizes for such purposes are 0402 to 1005 (metric coding).

In some other aspects, it is now proposed to integrate the ESD functionality into the frame. This integration can be achieved in a number of ways, using known techniques and manufacturing processes to produce the diode. For example, back to back Zehner diodes can be used as ESD diodes. In the following, when referring to the pn-junction of an ESD protection diode in this context, this refers to a device or semiconductor structure that comprises an ESD functionality in a very general sense. In certain embodiments, such functionality can be provided by a pn-junction but possibly also by a semiconductor-metal junction or by half-liter semiconductor junctions with different doping and doping gradients.

By combining both functionalities in one frame, the functionalities can be integrated into the package with low space requirements. For this purpose, e.g. in the bottom side of the silicon frame integrates the ESD functionality. Then two additional pads on the back of the frame are used for the ESD protection. Alternatively, the frame can have only 2 pads on the back of the frame and the anode and/or cathode connection of the ESD protection diode is used for mounting the frame on the substrate. A twist-proof variant can be achieved by providing an ESD protection diode on two (four for square frames) sides or corners of the frame. During assembly, the excess diodes are short-circuited or are not functionally connected and one diode then serves as the ESD protection diode. Since the manufacture of several diodes in one frame does not involve any additional expense due to semiconductor processing, this variant is cost-neutral.

Thus, in one aspect, the frame is provided to integrate and/or form the ESD protection element. To form the ESD protection diode, or more generally the ESD protection element, the frame may comprise at least one first doped region and at least one second region of different doping adjacent thereto. The at least one first doped region is connected to a first of the two electrical contact pads, and the at least one second doped region is connected to a second of the two electrical contact pads. Regions of different doping form a so-called pn-junction, which forms a diode depending on the interconnection. By suitable doping, the electrical properties can be adapted to requirements over a wide range. The frame thus has at least one pn-junction forming ESD protection, which is electrically connected to the two contact pads for electrical contacting of the optoelectronic device arranged on them.

In one aspect, the metallic interconnection layer of the frame to the support may also be used as an electrical conductor. One of the at least one first and second doped regions is electrically connected to the metallic layer connecting the frame to the support.

In a further embodiment, the frame comprises a first contact region for the at least one first doped region or the pn-junction on the side facing the support, which extends along a side wall in the inner region. The metallic layer forms a second contact region for the at least one first doped region or the pn-junction. In this embodiment, one such first contact region may be provided on each side of the interior region, each contacting a corresponding first doped region. In this way, a twist-proof design of the frame is achieved.

An alternative embodiment is created in that the frame has, on the side facing the support, in at least one of the corners, a first contact region for the at least one first doped region or the pn-junction, which faces the inner region, and the metallic layer forms a second contact region for the at least one first doped region or the pn-junction. In a further aspect, this embodiment may also be configured to be twist-resistant by providing a first contact region in each corner that contacts a corresponding first doped region or corresponding pn-junction, respectively.

In one aspect, one of the two contact pads for electrically contacting the optoelectronic device disposed on the two contact pads is electrically connected to the metallic layer connecting the frame to the carrier. As a result, the optoelectronic device is connected in parallel with the ESD protection element in the frame.

Another aspect relates to implementation in pre-existing embodiments. In one aspect, the device comprises a socket surrounding the frame and disposed on the carrier. The carrier and the socket are made of the same material. Similarly, the socket may be connected to the carrier in a gas-tight manner via a metallic solder, optionally comprising gold. In another aspect, the frame is spaced apart from the socket and/or a height of the frame is less than a height of the socket. The frame may additionally serve as a support for a transparent window. In such an aspect, the frame can thus be inserted into an existing housing. In one embodiment, a window that is transparent to light in the ultraviolet spectrum is attached to the socket and is disposed above the frame and is connected to the frame in a gas-tight manner. The carrier and/or also the socket can be made with a ceramic material, in particular based on AlN.

Another aspect relates to a method of manufacturing a package for UV light. In a first step, the method comprises providing a silicon substrate and forming a cavity in the silicon substrate, in particular by anisotropic etching. Then the surface of the cavity is metallized. Then, an auxiliary substrate is attached to a top surface of an edge region of the cavity and optionally bonded thereto. The silicon material is removed from the back side, i.e., the side opposite to the cavity, in the area of the cavity so that a silicon frame is formed. The removal can be done mechanically or chemically. Finally, the silicon frame is arranged on a carrier in such a way that the silicon frame forms an inner region in which an optoelectronic device is arranged.

In this way, a silicon frame can be created in a suitable manner, which is connected to the carrier in a gas-tight manner and which has an inner area in which the component is arranged. Advantageously, the auxiliary carrier can also be used as a window for hermetic covering. For this purpose, it may be provided that a transparent auxiliary carrier, in particular comprising $SiO_2$ or $Al_2O_3$ is provided. Optionally, a coating of at least one side of the transparent auxiliary carrier can be provided to match a refractive index to the surrounding medium. A metallic layer or layer sequence can be applied in the form of a circumferential frame, wherein the metallic layer or layer sequence comprises gold.

Dimensions of the circumferential frame can essentially correspond to dimensions of the top of the edge area of the cavity. This allows for hermetic and gas-tight attachment of the auxiliary carrier to the frame so that it can also be used as an exit window. In another aspect, the silicon substrate is patterned to form at least one rectangular, in particular square, frame structure by etching along a <100> plane of the silicon substrate. In particular, KOH is a suitable etching material for this purpose.

Another aspect concerns the formation of an ESD protection element in the frame. Thus, provision can be made to form a pn-junction forming an ESD protection diode in at least one edge region of the silicon substrate, which is located outside the region in which the cavity is located. In other words, an ESD protection diode is formed in the area of the silicon substrate that later forms the frame. In this case, a passivation layer can also be provided on the surface before it is mirrored or metallized. In this way, a short circuit can be avoided. In one aspect, a total of 4 individually drivable pn-junctions are formed, wherein the 4 pn-junctions may have a common layer. The 4 pn-junctions exhibit a certain symmetry, such that a twist-proof arrangement is thereby ensured.

During a backside removal of silicon material, in one embodiment of the method, a first contact connected to the common layer and four second contacts each connected to the corresponding pn-junction may be formed. To achieve a twist-proof embodiment, the pn-junction forming the ESD protection diode may be formed along a side surface of the cavity or in a corner of the cavity in the silicon frame. Likewise, it is possible to form the contacts on the bottom side of the frame to the respective pn-junctions along a side surface of the cavity or in a corner of the cavity in the silicon frame.

Various steps may be considered for metallizing the surface of the cavity. For example, in one aspect, the cavity may be patterned prior to a metallization step such that the bottom of the cavity remains free of a metallization layer and the metallization layer is formed primarily along the sidewalls. To reduce short-circuiting or even aging of the frame, a passivation layer can be deposited on the frame. This comprises at least one of $SiO_2$, SiN, SiON, TEOS, NbO, $Al_2O_3$, $TA_2O_5$ or a combination thereof. Metallization of the surface of the cavity is carried out with a reflective layer, in particular of aluminum or silver.

A metallic solder is applied to the top surface of the edge portion of the cavity to secure a window, the metallic solder having a layer sequence comprising gold and tin. Finally, parting trenches may be etched or otherwise formed along the edge portion of the cavity, wherein a depth of the parting trenches substantially corresponds to a depth of the cavity.

Another aspect relates to manufacturing of the entire package, i.e., including the optoelectronic device. In one aspect, a structured carrier is provided comprising two contact pads on one surface. The optoelectronic device is applied to these and attached thereto, for example via a solder. Then, around the device, the frame is aligned, placed on the carrier, and attached thereto to form a hermetically sealed connection. If necessary, this step can be performed under inert gas so that the cavity contains only such inert gas. Alternatively, the last two steps can be interchanged, i.e. the silicon frame is first applied around the two contact pads on the carrier and attached to it. Next, the optoelectronic device is placed on the two contact pads. In another aspect, the cavity can also be filled with a transparent material, for example a plastic.

In one aspect, providing a patterned carrier may include patterning the carrier to form a metallic layer on the surface of the carrier having substantially the dimensions of the silicon frame. Furthermore, in some embodiments, after a backside removal of silicon material in the region of the cavity, a singulation of the auxiliary carrier is performed.

BRIEF SUMMARY OF THE DRAWINGS

The invention is explained in detail below with reference to the drawings.

DETAILED DESCRIPTION

The following embodiment examples concern various aspects and combinations thereof according to the proposed principle. In this context, the embodiment examples are not generally shown to scale. Likewise, various elements may be shown enlarged or reduced in size to emphasize individual aspects. It is understood that the individual aspects of the embodiments shown in the above figures can be readily combined without contradicting the principle of the invention. Some aspects show a regular structure or shape. It should be noted here that slight differences and deviations from the ideal shape occur in practice, but without this contradicting the inventive idea. In addition, the individual figures and aspects are not necessarily shown in correct size, nor do the proportions between individual elements have to be substantially correct. some aspects are highlighted by showing them enlarged. However, terms such as “above”, “above” “below”, “below” “larger”, “smaller” and the like are correctly represented with respect to the elements in the figures. In this respect, it is possible to infer such relationships between elements based on the figures.

Figure 1:
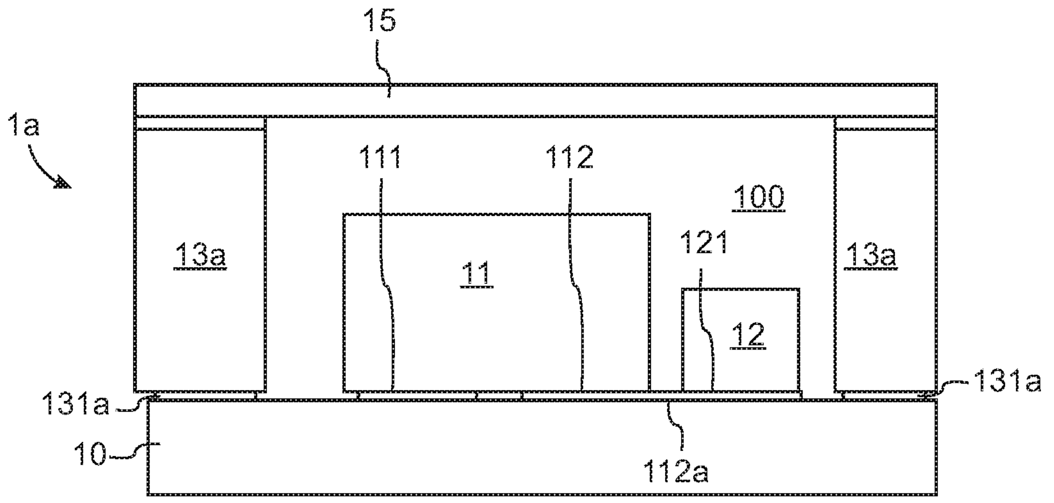
FIG. 1 shows a conventional design of an LED package for generating UV light with a protective diode.

FIG. 1 shows an LED package with an ESD protection diode, as it is used for a generation of UV light and in particular also UV-C light. The known package comprises a carrier substrate 10 on which an optoelectronic device 11 is arranged on two contact pads 111 and 112. The optoelectronic device 11 is designed in an operation to emit UV-C light. For this purpose, the device 11 comprises an active layer, not shown here, in which charge carrier recombination takes place with emission of photons in the ultraviolet spectrum.

The optoelectronic device 11 is surrounded by a frame which is attached to the carrier 10 by means of an adhesive 131*a* or a solder. The frame 13*a* encloses the optoelectronic device, for example, by means of a rectangular or square structure. A transparent window is arranged on the frame by means of an adhesive or a solder. Thus, the frame together with the carrier substrate 10 and the window 15 forms a cavity 100 in which the optoelectronic device is arranged. Furthermore, in order to protect the optoelectronic device from damage, for example a sudden current or voltage surge, an ESD protection diode 12 is provided in the package shown. In addition to the optoelectronic device, this is connected to the optoelectronic device via a contact pad 121. In the embodiment shown here, the connection is created by means of a contact web 112*a*.

Figure 11:
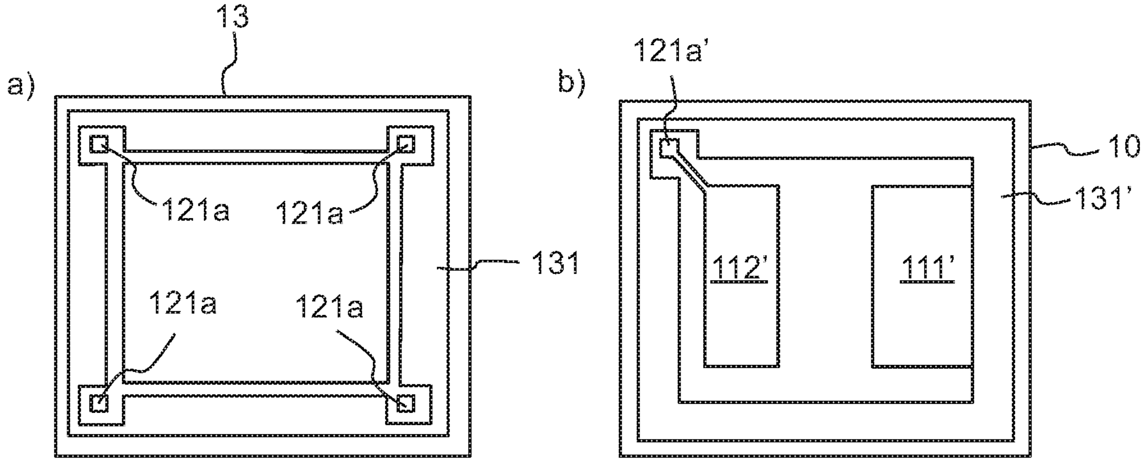
FIG. 11 shows a further rear view of the frame with diodes integrated therein and a corresponding top view of the support substrate for mounting the frame.

The known package as shown in FIG. 11 has a relatively large surface area. In particular, the side walls of the frame 13*a* are spaced from the optoelectronic device. This is why, on the one hand, frequent reflections occur on the walls inside the cavity during operation, which worsens the beam characteristics. On the other hand, the ESD protection diode 11 can absorb part of the radiation emitted by the device, thus contributing to a reduction in the intensity of the device. Overall, the size of the entire package and the location of the ESD protection diode within the frame is rather obstructive, so the need for new and innovative solutions exists here.

Figure 2:
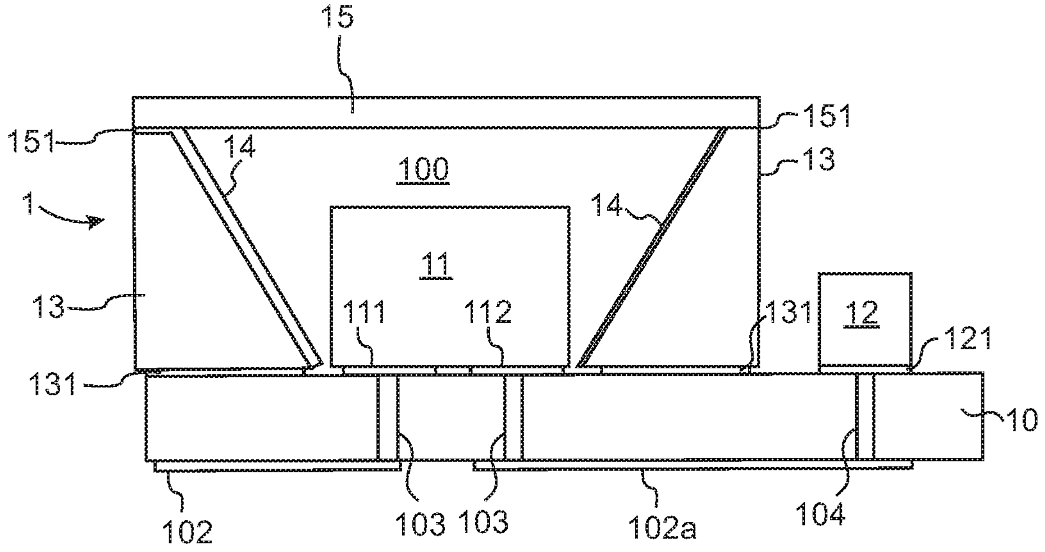
FIG. 2 shows an embodiment of an LED package for UV-C light according to the proposed principle.

FIG. 2 shows an embodiment of an LED package which is particularly suitable for generating and emitting UV light. Various measures are presented that ensure optimization of the emitted intensity.

The LED package comprises a substrate carrier 10, on the surface of which two contact pads 111 and 112 are arranged in a so-called inner region. This inner area is formed by a surrounding frame 13, which is attached to the substrate carrier 10 via a metallic solder 131. The metallic solder hermetically seals the frame to the substrate carrier towards the underside. Alternatively, a suitable adhesive can also be provided, which outgasses little. The optoelectronic device 11 is now arranged inside the inner area and on the two contact pads.

In contrast to known techniques, the frame 13 is beveled, i.e., it is designed with an angle relative to a surface perpendicular to the surface of the substrate carrier or with an angle relative to a surface parallel to the surface of the substrate carrier. For example, this angle with respect to the surface to the substrate carrier can be in the range of 50° to 60°, in particular in the range of 54° to 55°. The beveled surface of the frame 13 surrounding the optoelectronic device 11 is covered with a mirror layer 14. In one embodiment, this is applied directly to the frame. The mirror layer is formed with aluminum or silver. In another example, the mirror layer, for example made of aluminum, silver or another highly reflective material, is arranged on the beveled side surfaces of the frame 13 via an insulation layer. In this case, the frame 13 may be formed of silicon, a material that allows particularly simple processing, especially with respect to the angle of the beveled side surfaces. For example, silicon is etched by KOH in a suitable orientation so that the beveled side surfaces result from the anisotropic etching process.

A transparent window 15 is arranged on the top of the frame by means of a solder 151 or an adhesive. In the present example, the resulting hermetically sealed cavity is filled with an inert gas so that oxidative aging of the optoelectronic device is reduced or avoided altogether. The individual solder layers or adhesive elements 131 and 151 provide a gas-tight seal of the cavity.

Two feedthrough contacts 103 are also disposed in the substrate carrier 10 to connect the respective contact pads to leads or contacts on the underside of the substrate carrier. Specifically, the feedthrough 103 connects the contact pad 111 to the contact pad 102 on the underside of the substrate. In contrast, contact is also connected to ESD protection element 12 via contact line and another bushing. This protective element is arranged on contact pads 121 outside the frame.

By optimizing the frame with the beveled surfaces and the reflectors arranged on them, the package can be reduced in size. This allows the cost of the optical element, i.e. the frame with or without the reflector and the window, to be reduced. In addition, placing the ESD protection diode outside the cavity allows it to be optimized on the one hand and to increase the overall brightness of the device or LED package on the other. The light emitted by the optoelectronic device is reflected directly upwards by the reflector arranged next to the component and is therefore not absorbed in the cavity or the ESD protection diode.

In some embodiments, the optoelectronic device directly adjoins the reflector 13 and the mirror layer 14 disposed thereon at its underside, i.e., adjacent to the carrier substrate 10. In the illustrated example of embodiment, a small gap may be provided between the optoelectronic device and the reflector to allow for easier placement and to allow for some tolerance in placement. In another embodiment, the contact pads 111 and 112 are slightly raised so that the optoelectronic device is spaced slightly more from the supporting substrate by means of the contact pads. In such an embodiment, the reflector 13 with its mirror layer may extend below the component so that the component sits virtually on top of the reflector and the mirror layer. Such a package may offer additional advantages, especially for volume emitters, since even downwardly reflected light is reflected and deflected upwardly toward the window by the reflector and mirror layers 14 in this way.

Figure 3:
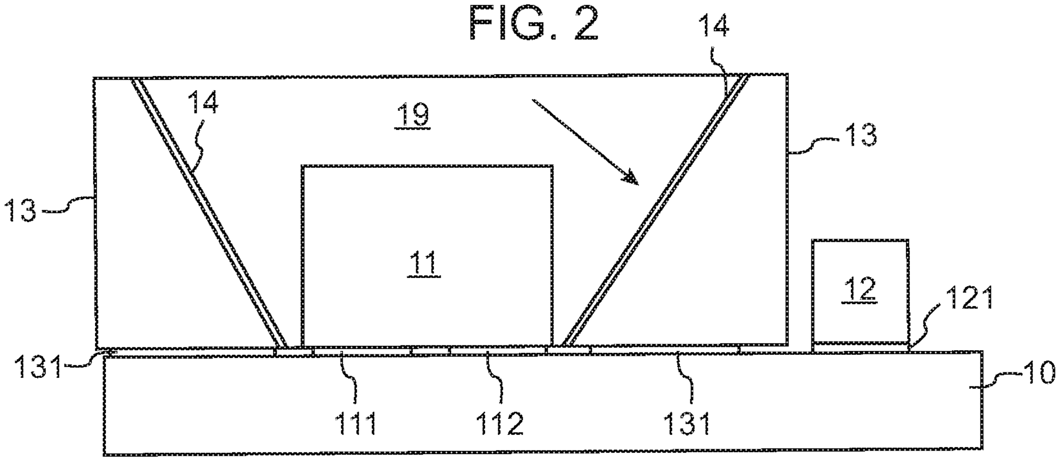
FIG. 3 shows a second embodiment of an LED package for UV-C light according to the proposed principle.

FIG. 3 shows a supplementary embodiment according to the proposed principle. In this, the carrier substrate is designed without further feedthroughs, but the leads are arranged on the upper side of the carrier substrate 10. Specifically, the contact pads 111 and 112, respectively, lead to the ESD protection diode and its contact pads 121, so that a parallel circuit is formed between the ESD protection diode 12 and the optoelectronic device 11, essentially as in the previous examples. The cavity shown in this embodiment example is designed to be open at the top, i.e. without another transparent window. In this context, in order to reduce degradation and aging of the optoelectronic device, for example due to oxidation or other processes, it is envisaged to completely fill the cavity with a transparent material 19. In the proposed embodiment, this transparent material extends to the top of the frame and is flush with it.

In some embodiments, the transparent material may extend over and completely cover the frame. The transparent material is designed to prevent or greatly reduce diffusion of oxygen into the material and toward the optoelectronic device.

Figure 4:
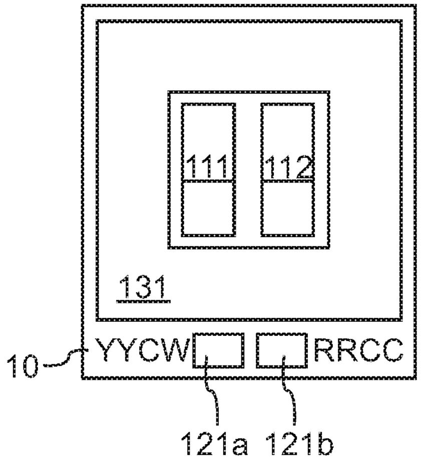
FIG. 4 shows a top view of a substrate carrier according to the proposed principle.

A top view of the carrier substrate is shown in FIG. 4, in which the two contact pads 121*a* and 121*b* for the ESD protection diode are arranged outside the base area for the frame 131 and at a distance from it. The base area of the frame itself is square and encloses two rectangular contact pads 111 and 112, which are connected to the corresponding contact pads 121*a* and 121*b* via feedthroughs and leads on the underside of the carrier 10, which are not shown here. The silicon frame is now applied to the base surface and connected thereto. Base surface 131 as well as the contact pads 111, 112, 121*a* and 121*b* can be implemented with a metallic solder based, for example, on gold and zinc. In addition to good electrical contact, this solder also allows mechanical attachment of the corresponding components to the contact pads and a hermetic, i.e. gas-tight, seal.

Figure 5:
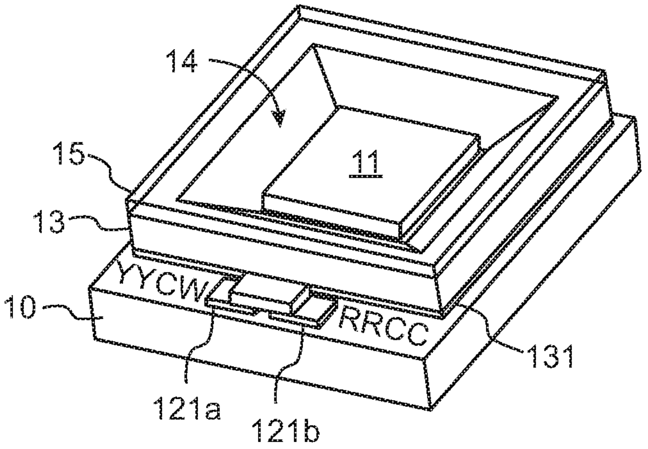
FIG. 5 presents a perspective view of a further embodiment of an LED package according to the proposed principle.

FIG. 5 shows a perspective view of an LED package according to the proposed principle. For example, the carrier substrate 10 shown in FIG. 4 is equipped with the individual components. An ESD protection diode is soldered to the two contact pads 121*a* and 121*b* and is firmly connected to them. The ESD protection diode is of SMD design, for example with the metric size 0201 or 0402. Other special sizes for such SMD protection diodes are also conceivable in this design. The advantage of already finished components is the simple procurement and the very favorable price.

The ESD protection diode is arranged along one side of the circumferential frame 13. This is applied to and mounted on the metallic solder of the surface 131. The frame 13 has sloping side surfaces which extend squarely around the optoelectronic device 11 arranged in the center. As shown, the side surfaces of the circumferential frame and the top surface of the frame are covered with a mirror layer of aluminum. Furthermore, the transparent window 15 is arranged on the upper side of the circumferential frame. Thus, the window, the frame 13, and the surface of the substrate 10 form a hermetically sealed cavity in which the component 11 is disposed.

The ESD protection diode prevents a short circuit, a voltage pulse or a current pulse on the optoelectronic device in one operation and dissipates such a pulse through the ESD component on the pads 121*a* and 121*b*. Thus, damage to the expensive optoelectronic device can be avoided. Overall, the ESD protection diode on the one hand and the hermetic encapsulation on the other hand thus greatly improve the service life of the entire package. In the event of a current or voltage pulse and destruction of the ESD protection diode by this, it can also be easily replaced and the component repaired in a simple manner.

Figure 6A:
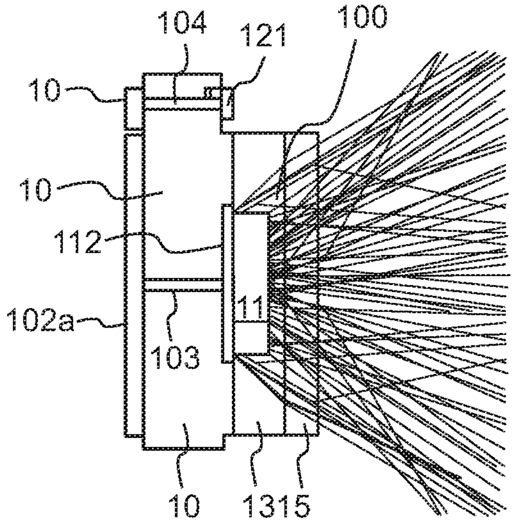
FIG. 6A shows a cross-sectional view of an LED package including a simulation of light beams.

FIG. 6A shows a cross-sectional view of an LED package for UV-C light according to the proposed principle. In this embodiment, a plurality of light beams are also drawn in, which represent a reflection at the side surfaces of the frame as a simulation result. Due to the reflection on the side surfaces, on the one hand, the light is directed to a greater extent and bundled in the form of a cone, and on the other hand, the intensity of the LED Package is thereby increased in the spatial region located in front of the LED Package. The LED package comprises the substrate support 10 in that a via 103 connects a contact pad 112 in the inner region of the substrate support to a second contact pad 102*a*. The inner region of the contact pad is formed by the circumferential frame 13, in that the optoelectronic device 11 is arranged. The circumferential frame 13 comprises side surfaces that are beveled, thereby redirecting the light emitted from the optoelectronic device 11 toward the transparent window 15.

Figure 6B:
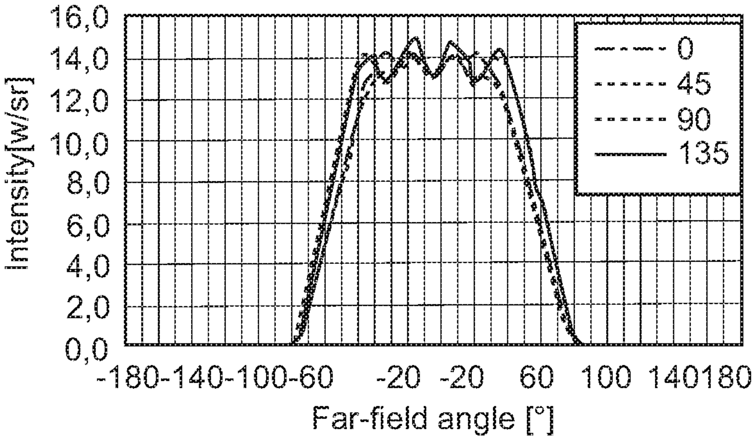
FIG. 6B shows an intensity angle diagram for a simulation result for an LED package according to the proposed principle.

The design with a reflective frame, as shown in FIGS. 5 and 6A, produces a relatively high intensity in a characteristically narrow radiation range. This is illustrated in FIG. 6B by a diagram showing various intersection angles 0, 45°, 90° and 135° through the far field of the diodes along which the intensity has been plotted. Here, in a range from +60° to −60°, an intensity has dropped by only half compared to a maximum value. In particular, in a smaller range around +20° to −20°, the intensity is significantly increased compared to a conventional solution with perpendicular sidewalls.

Another aspect relates to the design, shaping and positioning of the ESD protection element. As mentioned above, the frame 13 arranged around the optoelectronic device is often made of silicon. Silicon as a semiconductor material is well understood and sufficiently known with respect to its electrical properties.

Therefore, in order to further reduce a size of the LED package, it is proposed to arrange the diode, not outside on the carrier substrate, but inside in the frame. In general, two different aspects can be realized. On the one hand, the frame can include a small cavity in which the ESD protection diode is present on the carrier substrate. On the other hand, the frame itself can also form the ESD protection diode.

Figure 7A:
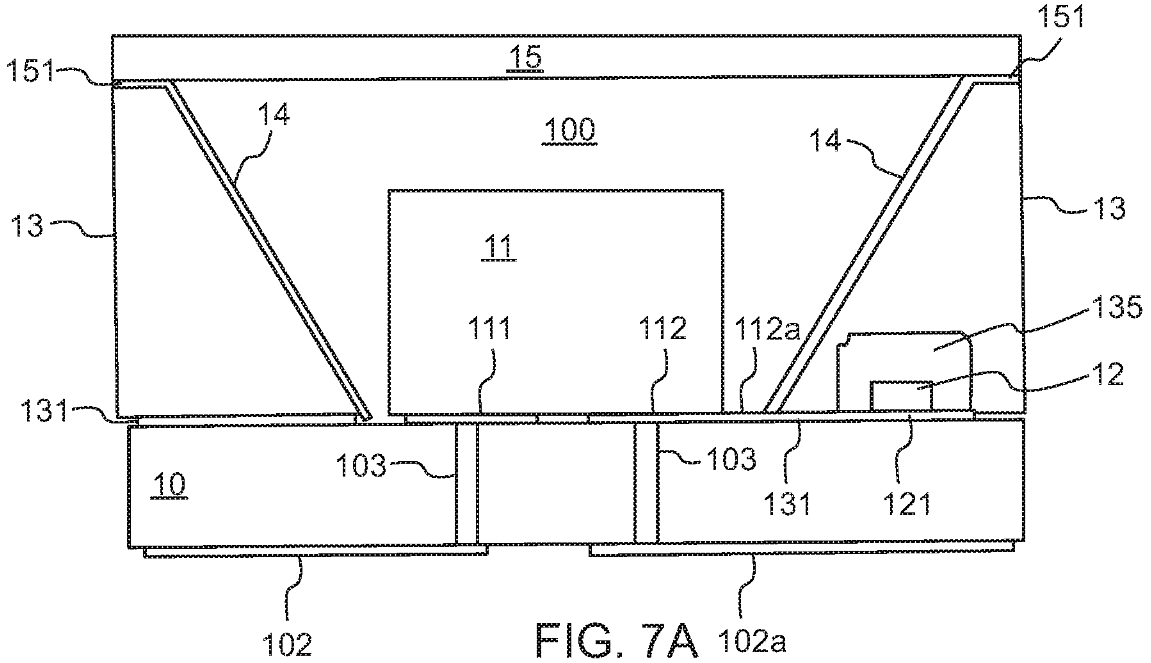
FIG. 7A is another embodiment of an LED package with integrated protection diode according to the proposed principle.

In one embodiment, a cavity is formed in the frame around an ESD protection diode, as realized as an SMD component in FIG. 5, for example. FIG. 7A shows such an embodiment. In this, a frame 13 is attached to a carrier substrate by means of a metallic solder 131. In one area of the frame, a cavity 135 is provided, the size of which exceeds that of the ESD protection diode 12. Nevertheless, this cavity or recess 135 is arranged so that it does not have an opening towards the cavity 100 or outwards towards a medium surrounding the package. Thus, in the case of the frame even with a cavity, hermetic encapsulation of the cavity is ensured.

In the cavity, the ESD protection diode 12 is applied to contact pads 121 on the substrate carrier 10 and connected to contact 112 via a metallic bridge 131 a lead 112*a*. A parallel connection is thus made through leads on the upper side of the substrate carrier 10. Nevertheless, the contact pads 111 and 112 are connected via feedthroughs to contact pads 102 and 102*a* on the lower side of the carrier substrate 10. These contact pads are also electrically connected to the ESD protection diode 12 in the cavity 135. In one operation, the LED package can thus be supplied with the necessary current or supply voltage via the contact pads 102 and 102*a*.

In this embodiment according to FIG. 7, the ESD protection diode is implemented in a cavity as a separate component. In another example, however, the frame itself can also be implemented with a diode so that it itself acts as an ESD protection diode. In this case, the good understanding of how to manufacture pn-junctions and diodes in the silicon material is an advantage.

Figure 7B:
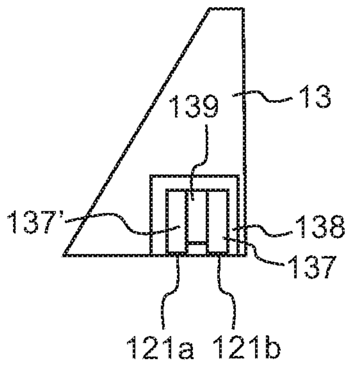
FIG. 7B shows a frame in which a pn-junction forming a diode is formed.

FIG. 7B shows an example of a frame in which a junction has been fabricated in silicon material and this forms an ESD protection diode via contact pads on the underside of the frame. Here, a trough is formed which is electrically insulated from the rest of the frame and has been passivated with a layer 138 of $SiO_2$. A first p-doped layer 137' and a second n-doped layer 137 are now implemented in the well, so that a back-to-back Zener diode is formed in the boundary region of these two layers. Both layers 137' and are connected to one of the contact pads 121*a* and 121*b*, respectively. An insulation extending into the material is provided between the contact pads to prevent a short circuit. The pn-junction forms a diode. This design shown in FIG. 7B is only exemplary, the pn-junction layer can also be arranged parallel to the underside of the frame. However, the diode is isolated from the rest of the frame by the trough. In one example, the insulation can also be arranged on only one side, for example around the n-doped layer. In such a case, the p-doped side would be connected to the frame.

Such a frame is thus a base for the cavity shown in FIG. 7*a* as well as for the ESD protection diode against overvoltage or current flashover to protect the component.

Figure 8:
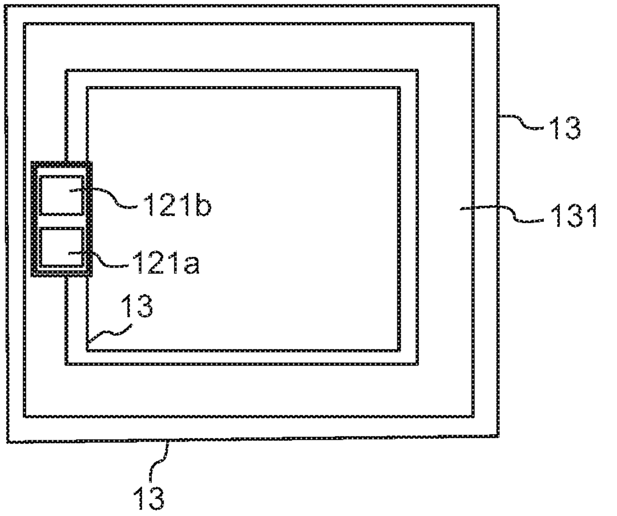
FIG. 8 shows a rear view of the frame according to the embodiment of FIG. 7B.

FIG. 8 shows a rear view of a frame in which a diode has been implemented as shown in FIG. 7B. This diode is connected with its respective doped layers to the contact sides 121*a* and 121*b* on the rear side of the frame. Contacts 121*a* and 121*b* are made with a metallic solder and are electrically insulated from the metallic solder of the surrounding frame 131. This prevents a short circuit between the frame and the carrier substrate due to the metallic solder in the area 131.

Figure 9:
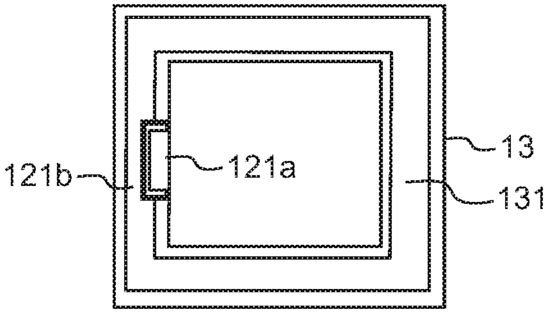
FIG. 9 illustrates an alternative embodiment in view of the rear frames.

Alternatively, however, the surrounding metallic layer 131 can also serve as an additional contact pad. FIG. 9 shows such an embodiment in top view of the frame, in which the diode formed in the frame is electrically connected to a contact pad 121*b*. The contact pad forms part of the mechanical layer 131 on the underside of the frame, securing it to the supporting substrate (not shown here). The second contact pad 121*b* is open to the interior of the frame 13.

FIGS. 10*a* and 10*b* and 11*a* and 11*b* show further embodiments for various frames with ESD protection diodes integrated therein and the corresponding surface on the carrier substrate.

Figure 10:
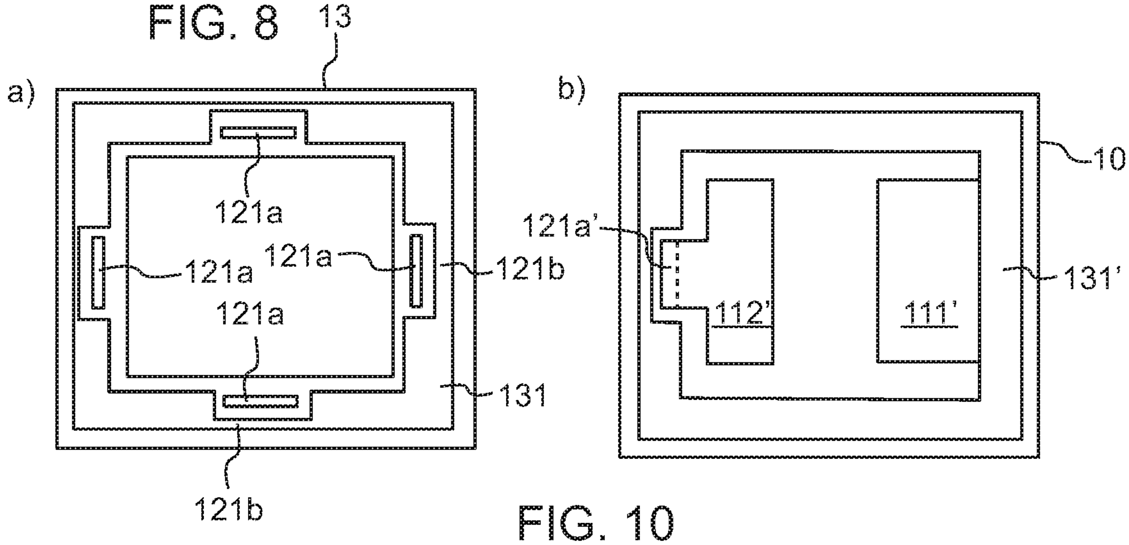
FIG. 10 is a rear view of the frame with diode integrated therein according to the proposed principle and a corresponding view for the carrier substrate for mounting the frame.

FIG. 10*a* shows a top view of the underside of a frame, where the frame is designed as an twist-proof frame with a total of four ESD protection diodes. These are integrated into the material of the frame and may comprise, for example, the shape shown in FIG. 7B. Each protection diode is connected to a first contact pad 121*a*. A second contact pad 121*b* also forms metallization layer 131, thus forming a contact region common to each pn-junction. The contact areas 121*a* of each pn-junction are now arranged along each side surface of the frame 13. In each case, two contact pads are located opposite each other. In this way, as shown, a twist-proof arrangement is ensured, since the square frame is rotationally symmetrical about 90°.

FIG. 10*b* shows the corresponding top view of the carrier substrate with the corresponding areas of a metallization layer 131'. This forms the base onto which the frame is placed in a further process step. The metallization layer 131' is also electrically conductively connected to the first contact pad 111'. A second contact pad 112 for the optoelectronic device to be applied is connected to an area 121 via a contact web. This area corresponds to one of the contact pads 121*a* of the frame of FIG. 10*a*. After the frame has been applied to the carrier substrate, one of the four first contact pads 121*a* of the frame 13 makes contact with the corresponding area 121. The orientation of the frame 13 is not important, since it is rotationally symmetrical.

FIG. 11 shows a similar alternative embodiment in which the pn-junction is located near the corner regions of the frame 13. Specifically, in FIG. 11*a*, four first contact regions 121*a* are provided that are located near respective corners of the frame 13. The first contact regions 121*a* are electrically insulated from the surrounding metallization layer 131, with the metallization layer also forming the second contact pad for each of the ESD protection diodes. This embodiment of the frame 13 is also rotationally symmetrical. The corresponding embodiment for the metallization on the carrier substrate 10 is shown in FIG. 11*b*. The circumferential metallization layer 131' is designed in electrically conductive connection with the contact pad 111'. The contact pad 112' for the optoelectronic device is connected to an area 121*a*' via a bridge. This arrangement also ensures that the frame can be mounted on the substrate carrier without twisting. Since the diodes of the frame are electrically isolated from each other, further measures to prevent a short circuit are not necessary.

Figure 12:
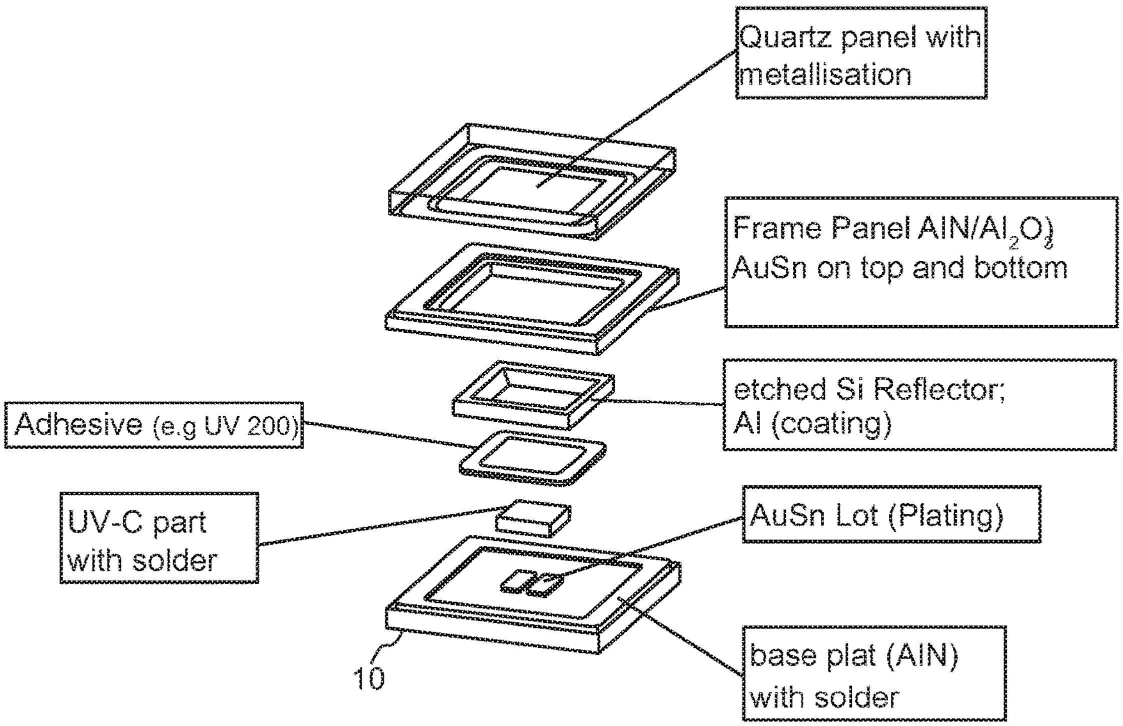
FIG. 12 shows an exploded view of the individual elements of an LED package according to the proposed principle.

FIG. 12 shows an exploded view of an LED package for UV light according to the proposed principle with the individual elements. This design is based on a package that is also suitable for laser applications. The package comprises a stack of several ceramic layers, which are joined together to form a hermetic, fully inorganic and very robust cavity.

In the exploded view of FIG. 12, the package comprises, among other things, the substrate carrier as a base plate made of AlN with the circulating solder material deposited on it, as well as two contact pads with a gold-tin alloy. The UV-C component is placed on the two contact pads and attached to them. The original package now further comprises a frame panel based on a ceramic layer, which is placed on the base plate around the UV-C component, i.e. the optoelectronic device, and attached to the base plate by means of the solder. The panel can also be made of AlN or also sapphire, i.e. $Al_2O_3$. A quartz panel with a metallization layer is then applied to the panel, the height of which is greater than the height of the UV-C component. The quartz panel is transparent to the light generated by the component. A complete, gas-tight and hermetic cavity is created by the multiple metallic layers based on a gold alloy. According to the invention, an adhesive or a further metallic layer is now also provided, to which the processed reflector made of silicon is applied. This is arranged in the inner area of the frame plate and attached to the substrate by means of the solder layer or a non-outgassing, UV-resistant adhesive.

The individual joining steps can be carried out on the basis of the individual structures shown. The package presented here is thus suitable for high volumes at comparatively attractive costs, since the individual elements can be combined or omitted as required. Due to its high flexibility, the proposed package can thus be used not only for UV-C applications, but also for other applications and thus for a wide range of products.

The etched silicon reflector is created from silicon by so-called KOH etching. By etching with potassium hydroxide along the crystallographic plane of silicon, cavities with sidewalls whose flank angle is 54.7° can be created in a simple manner. A reflective layer is then deposited on the silicon etched in this way, for example of aluminum, which is characterized by high reflectivity, especially in the UV-C range. The different solder layers allow the cavity to be created hermetically, so there is no need for another layer on the UV-C component to protect it. As a result, the light intensity of the UV-C component is not affected by additional layers.

In addition to a metallic solder, a UV-stable adhesive can also be used for fixing the etched silicon reflector. For example, an adhesive with the designation UV200 from the company Schott is suitable for this purpose.

Figure 13:
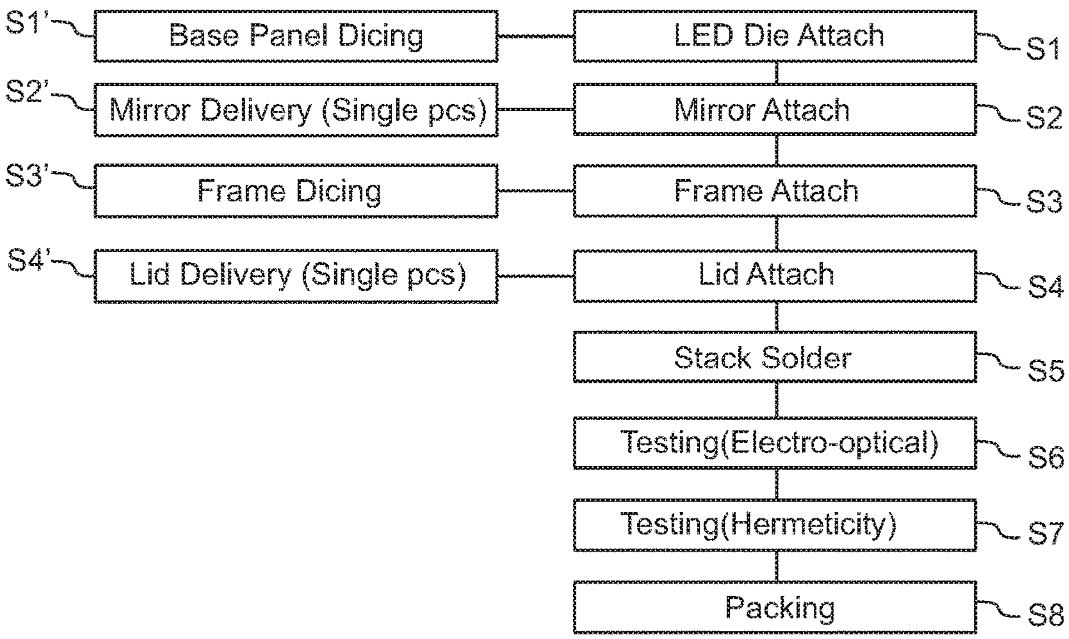
FIG. 13 shows a method examples of manufacturing an LED package is according to the proposed principle.

FIG. 13 shows the steps of a manufacturing process for low production volumes. In step S1, the optoelectronic device is applied to the carrier substrate, whereby the optoelectronic device and the carrier substrate are separated in the parallel steps S1' before or after application.

Subsequently, the reflective layer is arranged around the optoelectronic device in step S2 by means of an adhesive or a metallic solder. Here, the etched silicon reflector was created and separated as a mirror in previous processes S2'. After the reflector has been applied, the frame plate with its metallic solder layer is applied to the carrier substrate and attached to it in step S3. This frame plate was also generated and separated in parallel process steps S3'.

Subsequently, in step S4, a transparent quartz panel with metallization is applied to the frame panel as a transparent window, thus creating the cavity. The quartz panel was manufactured and separated in advance, as indicated in the parallel process step S4'. The individual elements are assembled in step S5, followed by electro-optical and mechanical testing of the entire package in steps S6 and S7. Only after successful completion of the test procedure is the package ready for use and can be packaged in a final step S8.

Figure 14:
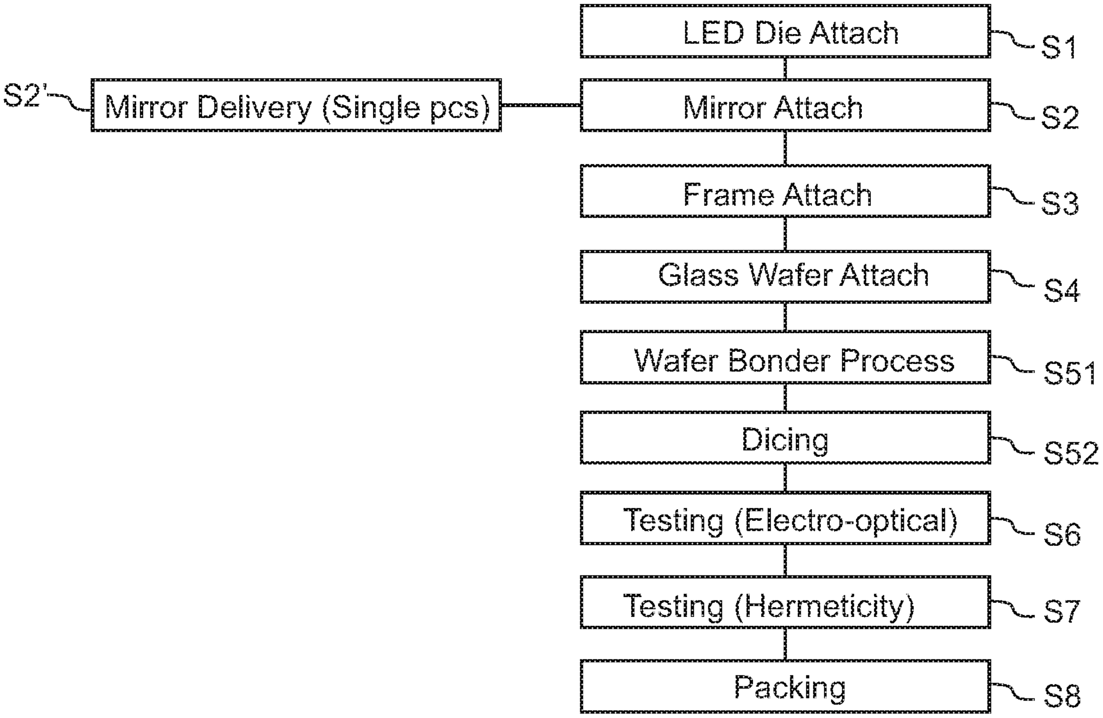
FIG. 14 is a second embodiment of a method for manufacturing an LED package for UV-C light according to the proposed principle.

FIG. 14, on the other hand, shows the rough process steps for producing a package according to the principles presented here for large volumes.

In step S1, the carrier substrate is provided, which can be made of a highly thermally conductive ceramic, for example, in order to achieve good dissipation of the heat loss. Suitable materials include ALN and silicon carbide SiC, both of which have high thermal conductivity. In contrast, the mirror comprises quartz glass or alternatively another material that is transparent to UV light. In addition, the window may have a further coating to achieve high optical efficiency and reduce reflections.

Contacts are provided to attach the optoelectronic device to the supporting substrate, and the optoelectronic device is mounted on the base plate by solder or a sintering process. Then, the reflector element made of coated silicon is inserted into the cavity with the aim of achieving high optical efficiency for the volume-emitting UV-C chip. Fixation of the mirror element in this cavity is done, for example, using a UV stable adhesive as indicated above. Alternatively, silver or gold-based sintering pastes can be used. As shown in the previous examples, special attention is paid to the distance between the optoelectronic device and the reflector element when mounting the reflector element, since the smallest possible distances should be realized.

After inserting the reflector element, the panel is now attached to the carrier substrate by means of the metallic layer in step S3. Subsequently, in step S4, the UV transparent window is applied to the frame panel and attached to it by means of a process. If necessary, additional bonding processes can take place as shown in step S51, before or after. In step S52, the substrate carrier is singulated and sufficiently tested in the following steps. In this embodiment, various manufacturing processes already known from other packages can be reused, which on the one hand increases flexibility and on the other hand reduces costs.

The embodiments shown here have a high optical efficiency due to the installation close to the chip on the reflector element. In addition, the package is hermetically sealed so that a very robust and durable package can be produced. The precisely fitting joining of ceramics and glass or silica during complete sintering reduces possible defects and improves the hermetic seal. The embodiments shown here exhibit high robustness to moisture, temperature, corrosion, and chemical cleaning agents, and are characterized by long life and operation due to the hermetic protection of the optoelectronic device and reflector.

In some embodiments, the package may be filled with an inert gas, such as nitrogen, helium, or argon, prior to the step of applying the transparent window. In addition, a material can be inserted into the package itself, which can be transparent to UV light. In other applications where UV light is not required, the material can also contain additional conversion particles so that light conversion takes place by means of the material. Alternatively, the transparent window can be replaced by a light conversion element. With a suitable combination of phosphors, it is thus possible to generate a spectrum that is precisely tailored to the application in question.

FIGS. 15A to 15E show a further embodiment of a manufacturing process for an LED package according to the proposed principle, whereby here individual elements of the later package also assume the function of an auxiliary or additional support carrier.

Figure 15A:
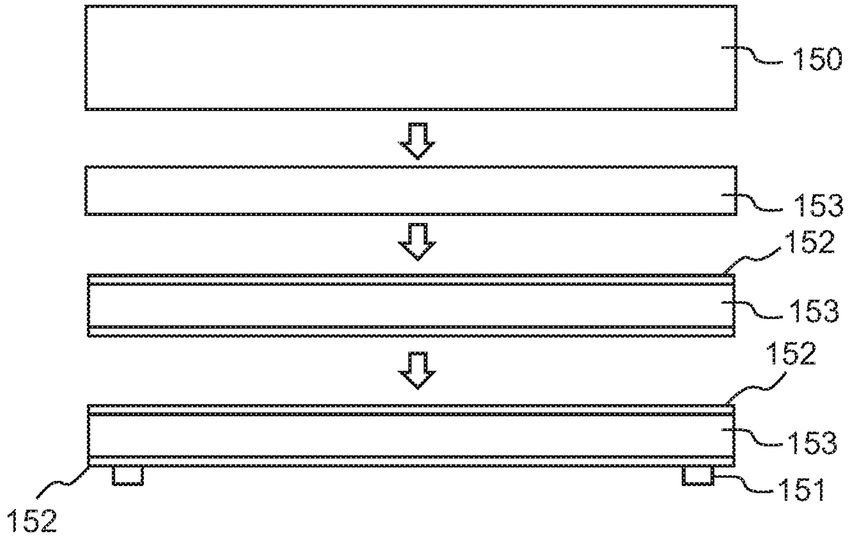
FIGS. 15 A to 15 E show various aspects of a manufacturing process for an LED package according to the proposed principle.

FIG. 15A shows the production of the window, which simultaneously assumes the function of the carrier. In a first step, a sapphire wafer 150 is provided, which may have a standard thickness of 1 mm and a diameter of 150 mm, for example. Then, in a second step, this sapphire wafer is ablated to the target thickness of the window, and then polished on both sides. The ablation can be carried out by means of a grinding process so that the thickness of the remaining window 153 is in the range of a few 100 μm. Subsequently, an anti-reflective layer 152 can optionally be applied to the upper side as well as the lower side. Depending on the application, this anti-reflective layer can also be omitted on the two sides or replaced by another structure for decoupling the light.

In a final step, a structure in the form of a frame is applied to the underside of the sapphire wafer thinned in this way by means of a metallic layer 151. The pattern is applied, for example, by means of a photoresist which is exposed and developed by means of a photomask. A full-surface coating of solder metal is then applied, covering the photoresist and resist-free areas. The photoresist and thus the solder metal on the resist is removed. What remains is the patterned solder metal on the wafer.

A combination of different elements is suitable as a possible metallic coating, for example a coating of Au, TiAu, TiPtAu, PtAu, AuSn, TiAuSn, TiPtAuSn, Pt AuSn, AuSnAu, TiAuSnAu, TiPtAuSnAu, PtAuSnAu or another combination of platinum, titanium, gold and tin as a layer sequence or alloy. In addition to structuring by means of an appropriate photomask, the metallic layer can also be deposited and applied by other means. In this case, the patterning is applied to the anti-reflective coating. In some embodiments, this anti-reflective coating may also be removed in the areas of the frame, if necessary, and thus the metallic coating may be arranged directly on the sapphire wafer.

In a particular embodiment, the sapphire wafer is thinned, polished, and then the frame is deposited using a titanium-gold coating.

Figure 15B:
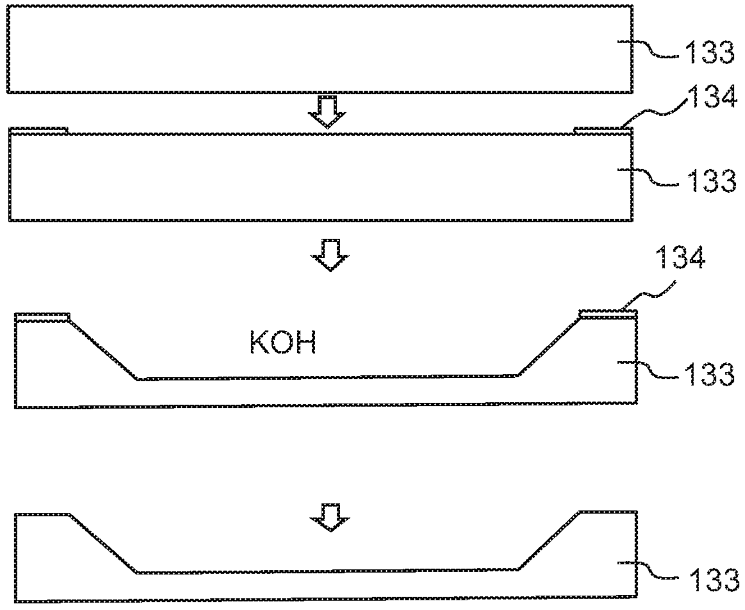

FIG. 15B shows the next step of a manufacturing process and in particular the fabrication of the silicon frame having the later cavity forming recess. In a first step, a (100) silicon substrate is provided. The silicon substrate 133 can also be a wafer, which should expediently have the same size as the sapphire wafer from the process in FIG. 15A. A hard mask 134, which is particularly stable to KOH, is then deposited thereon. This hard mask can, for example, consist of silicon dioxide $SiO_2$ or silicon nitride SiN. The hard mask 134 is then structured lithographically so that the areas of the subsequent cavity are exposed. In a subsequent step, the cavity is etched to the target depth using potassium hydroxide. It should be noted that the etching is not complete, i.e. the silicon substrate is not completely etched through.

Nevertheless, a so-called overetching can be provided, in which the etching bevels silicon in the cavity deeper than actually necessary. A homogeneous depth is not necessary, since later the remaining ridge or bottom of the cavity will be removed by other means. This etching based on the (100) silicon wafer results in a flank angle in the range of 54.7° due to the crystal orientation. The hard mask is then removed again to improve the edge structure. In an alternative embodiment, however, the hard mask can also remain on the silicon.

Figure 15C:
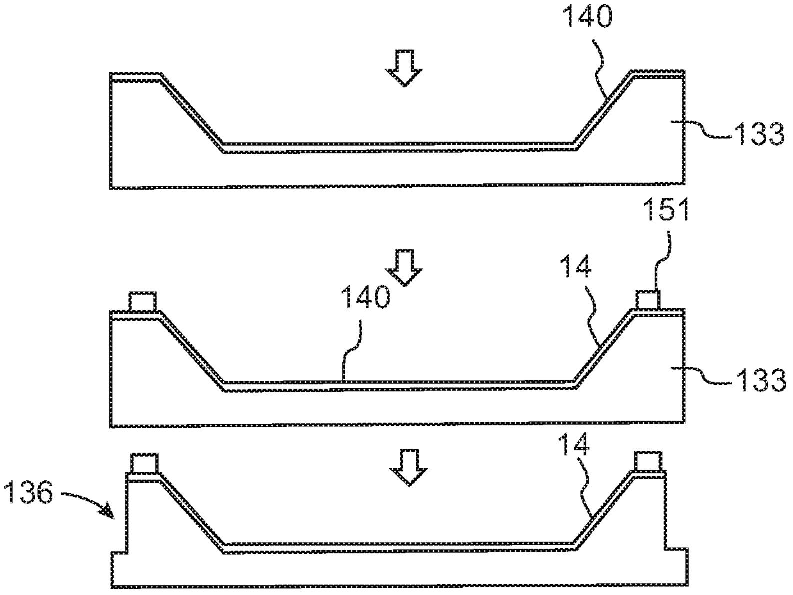

FIG. 15C shows the next process steps for manufacturing the reflector element. In this process, a reflective layer 140 is now deposited in one or more steps on the top surface, the side flanks and the bottom of the cavity of the silicon wafer 133. This can be done, for example, in various ways. For example, the top surface of the cavity can be passivated in a first step, for example by applying $SiO_2$, SiN, SiON, TEOS, NbO, $Al_2O_3$, $TA_2O_5$ or a combination thereof. Subsequently, the top surface passivated in this way is metallized with, for example, Al, Ag, TiAg, Rh, or CrRh. Alternatively, the top surface can be metallized directly. Just as alternatively, the top surface can also be additionally passivated after metallization in order to prevent degradation and aging of the applied metallized and reflective layer.

In a further alternative embodiment, the upper surface of the silicon wafer 133 can be structured lithographically before the metallization is applied. This makes it possible, for example, to create a structure in which the bottom of the cavity as well as the top edge of the silicon wafer 133 are not coated or only partially coated. However, this comes at the price of additional process steps.

After metallization of the surface, a structured solder metal 151 is now applied to the upper edge of the silicon wafer, i.e. outside the cavity. Suitable options for such a solder metal or metallic layer 151 are the elements already shown above based on gold, zinc, titanium, silver, platinum or combinations thereof.

The coating or the solder metal to be applied depends on the metallic coating of the transparent window shown in FIG. 15A. For example, a variant with zinc or zinc-gold should be selected as metallic layer 151 on the silicon frame if a combination without zinc was selected as metallic layer 151 for the transparent window in FIG. 15A or if no metallic layer was deposited on the window at all.

In other words, the metallic layer 151 should have zinc either on the transparent window or also on the silicon frame. In a final step, additional trenches can optionally be provided dry-chemically, which are etched into the silicon material from above. The depth can correspond to the depth of the cavity. The trenches serve to facilitate subsequent separation into the individual frames. This optional step of dry chemical etching of trenches can also be interchanged with the previous step of applying a solder.

In order to achieve a higher high effectiveness for UV light, it is recommended to passivate the top side and especially the side flanks with a material that includes or consists of aluminum. In this case, the aluminum material should only be applied up to the structured solder metal but not beyond, thus avoiding exposure of aluminum at the outer edge of the frame. This can be achieved by applying an additional patterned photomask prior to applying the aluminum layer. Similarly, in one embodiment, provision can be made to remove the metallization or passivation layer applied to the top of the silicon frame prior to applying the patterned solder metal. Without aluminum at the edge of the frame, the aging stability of the device is improved.

Figure 15D:
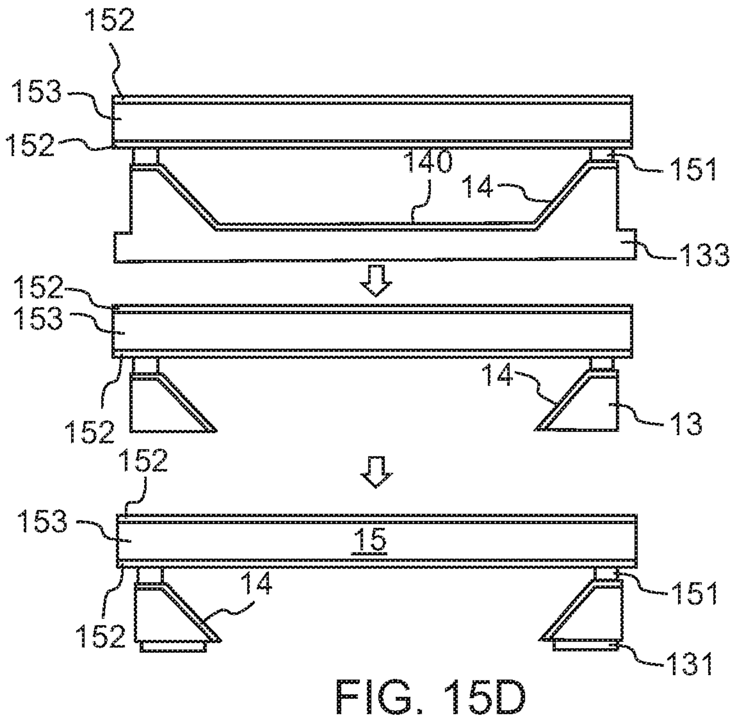

In the next process steps shown in FIG. 15D, the transparent window created in FIG. 15A is now used as a auxiliary carrier to further process the silicon frame. For this purpose, the transparent window is positioned over the corresponding areas in the silicon frame and the two metallic solder layers are joined by heating or another bonding step. As a result, a strong and non-detachable or only detachable connection is formed between the patterned silicon substrate 133 and the transparent window acting as an auxiliary carrier. In other words, a plurality of lids is produced in this step by bonding the window to the silicon substrate. Depending on the embodiment, in particular in the case of an on previous application of a metallic layer on the sapphire window, a bonding step is required.

The lid thus produced is then ground from below so that the cavity is opened. Alternatively, an isotropic etching process can be carried out until the cavity is opened. Grinding or other processes are then carried out until the desired frame thickness is achieved. Due to the fact that separation trenches are already present, these are also opened by the grinding or etching process, so that the transparent window is now provided with a number of frames. Alternatively, if the separation trenches were not created in the previous steps, the silicon can be dry-chemically etched back from below to the sapphire auxiliary carrier.

The last two steps of grinding to open the cavity and applying the transparent window created in FIG. 15A can also be interchanged so that silicon substrate is first fully processed, i.e. also opened, before the window is applied by means of the metallic solder layers.

A structured solder metal is then arranged from below on the frame outside the cavity. The choice of this metal stack meets the requirements of the subsequent process for bonding the substrate to the lid. In a final step, the lids produced in this way can finally be separated by so-called "stealth dicing" or another shape or breaking of the sapphire wafer along the separating trenches of the silicon frame.

Figure 15E:
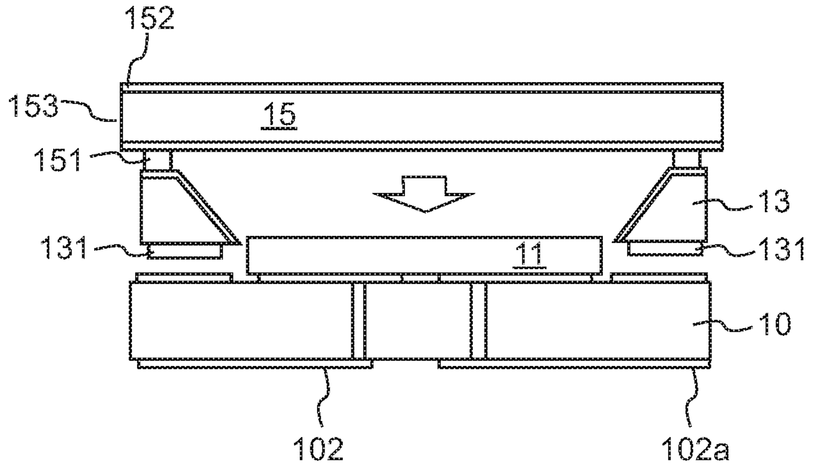

In a final step, shown in FIG. 15E, the thus separated frame can be positioned over the carrier substrate with the optoelectronic device and then connected to it. The manufacturing processes shown here can be combined in any way. Similarly, not only the silicon frame but also the frame plate shown in FIG. 12 could be manufactured by the process shown in FIG. 15.

REFERENCE LIST

1 LED Package
10 Substrate carrier
11 optoelectronic device
12 ESD protection diode
13 Frame
13*a* Frame
14 Mirror layer
15 Windows
19 Material
100 Cavity
103 Vias, through-hole plating
111, 112 Contact pads
121 Contact pad
121*a*, 121*b* Contact pads
131, 131*a* metallic solder
133 Silicon substrate
137, 137' doped layers
138 Insulating layer
139 pn transition
150 Sapphire wafer
151 metallic solder
153 Thinned wafer
152 Anti-reflective layer

The invention claimed is:

1. An LED package for UV light comprising:

an optoelectronic device, including a volume emitter, designed to emit light in the ultraviolet spectrum during operation, the volume emitter configured to emit light through at least one side surface of the optoelectronic device;

a carrier comprising two contact pads for electrically contacting the optoelectronic device arranged on the two contact pads;

an inorganic frame surrounding the optoelectronic device and arranged on the carrier, the side walls of the frame facing the optoelectronic device being beveled and opening towards a main radiation direction;

a transparent window attached to an upper side of the inorganic frame, wherein the carrier, the inorganic frame, and the transparent window define a hermetically sealed cavity, the optoelectronic device being arranged within the hermetically sealed cavity and surrounded by an inert gas, the hermetically sealed cavity being free of a solid encapsulant material; and an ESD protective element arranged on the carrier outside the hermetically sealed cavity, which is electrically connected to at least one of the two contact pads;

wherein the surrounding inorganic frame is connected to the carrier via a metallic solder including gold to form a gas-tight seal.

2. The LED package of claim 1, wherein the frame comprises silicon, and an angle of the beveled sidewalls with respect to a surface parallel to the carrier is in the range of 50° to 60°, or between 54° and 55°.

3. The LED package according to claim 1, wherein the beveled side walls of the frame comprise a reflective layer, optionally made of aluminum, silver or another material, and optionally with a reflectance of >80% for the light emitted by the optoelectronic device during operation.

4. The LED package according to claim 1, wherein the frame comprises a greater height than the optoelectronic device, or a height that is a factor of 1.2 to 1.8 times greater than the optoelectronic device.

5. The LED package according to claim 1, wherein the inner area formed by the frame substantially corresponds to a base area of the optoelectronic device.

6. The LED package according to claim 1, comprising a transparent material whose refractive index is between air and the material of a semiconductor body forming a surface and filling the cavity.

7. The LED package according to claim 1, further comprising at least one via in the inner region of the carrier connected to one of the two contact pads.

8. The LED package according to claim 1, wherein the carrier comprises two further contact pads on its upper side, which are each electrically connected to the corresponding contact pads in the inner area and on which the ESD protection element is arranged.

9. The LED package according to claim 1, wherein the frame comprises a cavity which is open towards the carrier and in which the ESD protection element, optionally an ESD protection diode, is arranged.

10. The LED package of claim 9, wherein metallization is provided on a base side of the frame connecting the frame to the carrier and electrically isolated from contact pads on the carrier in the region of the cavity.

11. The LED package according to claim 9, wherein the cavity of the frame is open towards the interior.

12. The LED package according to claim 1, wherein the frame integrates and/or forms the ESD protection element.

13. The LED package of claim 12, wherein the frame comprises at least one first doped region and at least one second region of different doping adjacent thereto, and the at least one first doped region is connected to a first of the two electrical contact pads and the at least one second doped region is connected to a second of the two electrical contact pads.

14. The LED package of claim 13, wherein one of the at least one first and second doped regions is electrically connected to a metallic layer that connects the frame to a substrate.

15. The LED package according to claim 14, wherein the frame comprises at least one pn-junction forming an ESD protection, which is electrically connected to the two contact pads for electrical contacting of the optoelectronic device arranged thereon.

16. The LED package according to claim 13, wherein the frame comprises, on the side facing the carrier, a first contact region for the at least one first doped region or a pn-junction extending along a side wall in the inner region, and wherein a metallic layer forms a second contact region for the at least one first doped region or the pn-junction.

17. The LED package of claim 16, wherein a first contact region is provided along each sidewall in the interior region, each contacting a corresponding first doped region.

18. The LED package according to claim 13, wherein the frame comprises, on the side facing the carrier, in at least one of corners, a first contact region for the at least one first doped region or a pn-junction facing the inner region, and a metallic layer forms a second contact region for the at least one first doped region or the pn-junction.

19. The LED package of claim 18, wherein a first contact region is provided in each corner, each contacting a corresponding first doped region or corresponding pn-junction.

20. The LED package according to claim 13, wherein one of the two contact pads for electrically contacting the optoelectronic device arranged on the two contact pads is electrically connected to a metallic layer connecting the frame to the carrier.

21. The LED package according to claim 1, further comprising a socket surrounding the frame and disposed on the carrier.

22. The LED package of claim 21, wherein the frame is spaced apart from the socket and/or a height of the frame is less than a height of the socket.

* * * * *